United States Patent [19]
Krishnamoorthy

[11] Patent Number: 6,085,343
[45] Date of Patent: Jul. 4, 2000

[54] METHOD FOR CONCURRENT TESTING OF ON-CHIP CIRCUITRY AND TIMING COUNTERS

[75] Inventor: Suresh Krishnamoorthy, Milpitas, Calif.

[73] Assignee: Sun Microsystems, Inc., Palo Alto, Calif.

[21] Appl. No.: 08/881,439

[22] Filed: Jun. 24, 1997

[51] Int. Cl.[7] .................................................. G06F 11/10
[52] U.S. Cl. ........................ 714/724; 326/93; 326/16; 377/118; 377/119
[58] Field of Search ................................... 714/724, 734, 714/731; 326/93, 16; 377/118, 119

[56] References Cited

U.S. PATENT DOCUMENTS

| | | | |
|---|---|---|---|
| 5,450,555 | 9/1995 | Brown et al. | 395/375 |
| 5,473,651 | 12/1995 | Guzinski et al. | 377/29 |

Primary Examiner—Albert De Cady
Assistant Examiner—Esaw Abraham
Attorney, Agent, or Firm—Conley, Rose & Tayon, PC; B. Noel Kivlin

[57] ABSTRACT

A testing method in which the stages in a multi-stage counter chain are tested sequentially. A counter chain is composed of two or more stages with the carry-out signal from each stage being coupled to the carry-in signal of a subsequent stage. Various circuit modules may be clocked from intermediate stages in the counter chain. In the test mode, the carry-out signal from a given stage is latched once it is asserted. Thereafter, the subsequent stage counts at a higher rate. In this manner, each stage of the chain is run through a complete count, thus verifying the functionality of each stage. Further, the first stage finishes a complete count cycle before the second stage begins counting at a higher rate. A circuit module which is clocked by the output of the first stage is therefore able to complete an operation before any circuit modules clocked by subsequent stages are triggered.

12 Claims, 3 Drawing Sheets

6,085,343

METHOD FOR CONCURRENT TESTING OF ON-CHIP CIRCUITRY AND TIMING COUNTERS

BACKGROUND OF THE INVENTION

1. Field of the Invention

This invention relates to the field of integrated circuit testing and in particular to a method for testing long range on-chip counters concurrently with other on-chip circuit tests.

2. Description of the Relevant Art

Integrated circuits (ICs) have found extensive use in all aspects of our society. The ever-increasing manufacturing time in which ICs are produced, coupled with the ever-increasing density and complexity, make ensuring the reliability of ICs an increasing challenge. ICs can suffer from faults caused by numerous imperfections in the fabrication process, and hence they must be tested. The testing is preferably performed at the manufacturing site to prevent shipment of faulty chips and to permit rapid location and elimination of problems in the fabrication process. Due to the quantity and complexity of the ICs to be tested, testing speed is a crucial factor, and it is desirable to minimize test time per chip.

IC chips are often synchronously controlled by a clock signal generated from an oscillator or other source. Various circuitry for generating the clock signal is normally included on the chip, and must also be tested. The generation circuitry typically includes frequency dividers (also referred to as counters) which reduce the oscillator frequency to a desired clock frequency. In many cases, the counters may be chained together to count long intervals. An example of this would be a microprocessor which operates from a crystal oscillator having a frequency of 10 MHz, and which requires an interrupt signal to be generated every 100 ms. For this example, a counter chain is needed to count $10^6$ cycles to generate the interrupt.

When counters are chained together, the first stage produces a reduced frequency clock which is coupled to the second stage. The second stage further reduces the clock frequency and subsequent stages repeat this pattern. It is noted that each stage produces a potential clock signal for clocking other on-chip circuitry. Various on-chip circuits may require clocking signals having different frequencies or having specific timing relationships with one another. Hence, it is not uncommon to have chips operating interdependent IC modules at different clock rates. Differing-rate clock signals are easily (and synchronously) available in the counter chain, and coupling to the appropriate stages in a counter chain is a preferred clock generation technique.

Testing a counter chain by running through $10^6$ clock cycles would require an unnecessary and undesirable time delay. A faster method for verifying the operation of counter chains is desired. The faster method would preferably be performed in parallel with tests of other IC modules on the chip, and would therefore preferably preserve the timing relationship between clock signals provided at various points in the timing chain.

SUMMARY OF THE INVENTION

The problems outlined above are in large part solved by a testing method in which the stages in a multi-stage counter chain are tested. Integrated circuit chips often include logic circuit modules which depend on clock signals from different stages in the multistage counter chain. This multi-stage counter chain testing method advantageously provides for proper operation of logic circuit modules which require a specific timing relationship between their respective clock signals. In one embodiment, a counter chain is composed of two or more stages with the carry-out signal from each stage being coupled to the carry-in signal of a subsequent stage. Various logic circuit modules may be clocked from intermediate stages in the counter chain. In the test mode, the carry-out signal from a given stage is latched upon assertion. In this manner, each stage of the chain is run through a complete count, thus verifying the functionality of each stage. Further, the first stage finishes a complete count cycle before the second stage begins counting at a higher rate. A logic circuit module which is clocked by the output of the first stage is therefore able to complete an operation before any logic circuit modules clocked by subsequent stages are triggered.

Broadly speaking, the present invention contemplates a multi-stage counter having a test configuration comprising a first stage counter, a latch, and a second stage counter. The first stage counter is configured to receive and count a clock signal. After reaching a predetermined value, the first stage counter asserts a carry-out signal. The latch is coupled to receive the carry-out signal from the first stage and configured to assert and hold an output signal in response to the assertion of the carry-out signal. The second stage is operatively coupled to receive the output signal and the clock signal. The second stage is configured to count the clock signal while the output signal is asserted. The second stage counts to a second predetermined value and asserts a second carry-out signal.

BRIEF DESCRIPTION OF THE DRAWINGS

Other objects and advantages of the invention will become apparent upon reading the following detailed description and upon reference to the accompanying drawings in which.

Figure 1:
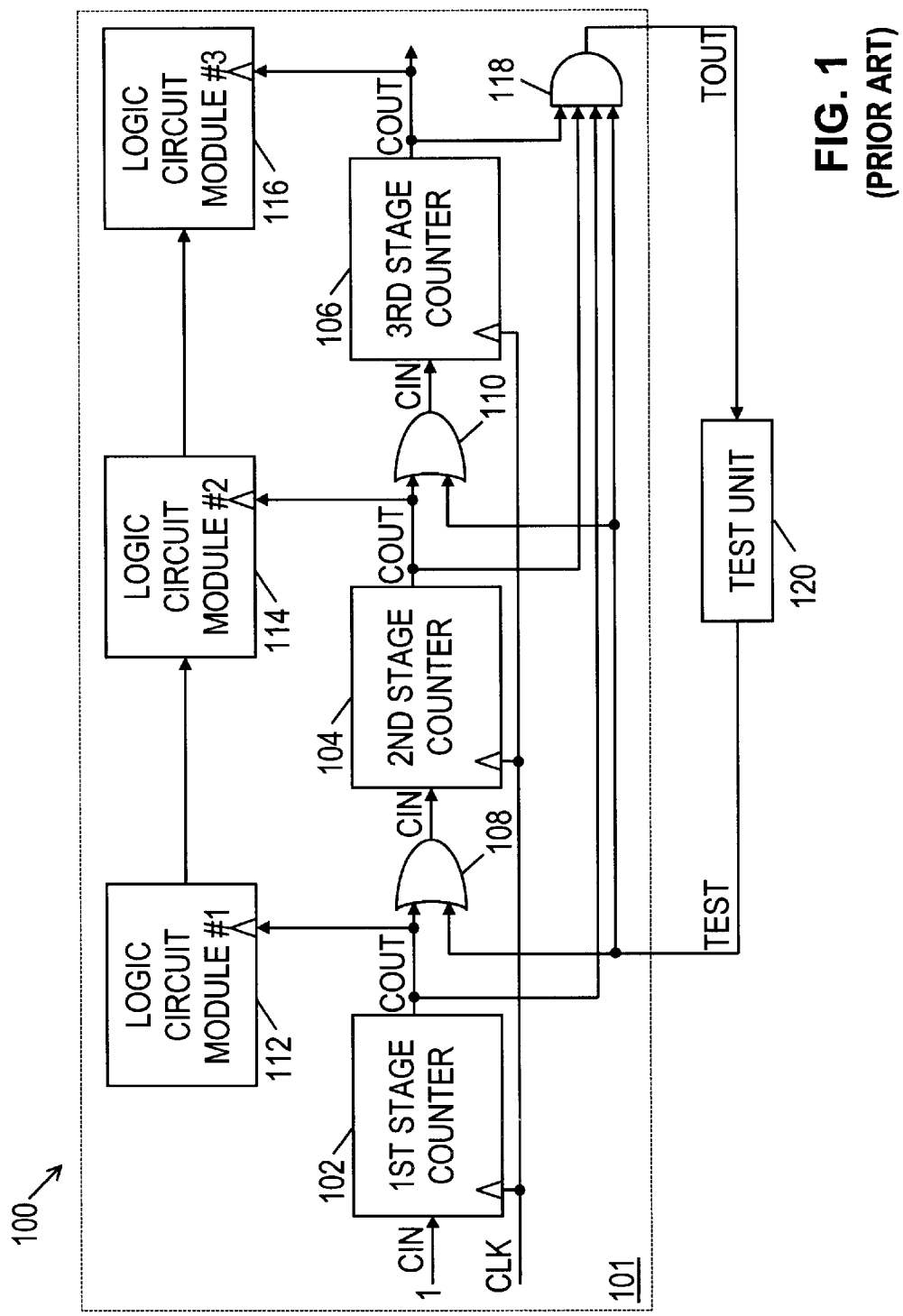
FIG. 1 shows a prior art multi-stage counter testing configuration.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 shows a prior art testing configuration 100 for testing long-count counter chains on IC chips. Testing configuration 100 comprises an IC chip 101 and a test unit 120. IC chip 101 includes a multi-stage counter chain having a first stage counter 102, a second stage counter 104, and a third stage counter 106. Each of these stages has a carry-in signal input and a carry-out signal output, and each stage is coupled to receive a clock signal. The first stage counter 102 has a carry-in signal fixed at 1. The carry-out signal of first stage counter 102 is coupled to the carry-in signal input of second stage 104 via an OR gate 108. Similarly, the carry-out signal of second stage 104 is coupled to the carry-in signal input of third stage 106 via an OR gate 110. OR-gates 108 and 110 are also coupled to receive a test signal from test unit 120. The carry-out signals from first stage 102, second stage 104, and third stage 106 are all coupled as inputs to an AND gate 118, along with the test signal from test unit 120. The AND gate 118 produces a clock-test output signal which is coupled to test unit 120.

IC chip 101 further includes exemplary circuit modules: logic circuit module #1 112, logic circuit module #2 114, and logic circuit module #3 116. The logic circuit module #1 112 is coupled to receive the carry-out clock signal from first stage counter 102. Logic circuit module #2 114 is coupled to receive the carry-out clock signal from second stage counter 104. Logic circuit module #3 116 is coupled to receive the carry-out clock signal from third stage counter 106. Logic circuit module #3 116 has a dependency on logic circuit module #2 114, which in turn has a dependency on logic circuit module #1 112.

As is explained further below, testing configuration 100 functions to test the stages of the multi-stage counter in parallel, thereby performing the counter chain test in the shortest possible time. However, testing configuration 100 has some undesirable limitations.

The stages are each configured to count transitions in the clock signal when the carry-in signal is asserted. First stage counter 102 always counts because the carry-in signal is fixed at 1. In normal operation (i.e. when the test signal is de-asserted) the second stage counter 104 counts only when the carry-out signal of the first stage counter 102 is asserted, so that for every complete cycle of first stage counter 102, second stage counter 104 increments by one. Similarly, during normal operation, third stage counter 106 increments once for every complete cycle of second stage counter 104.

Figure 3:
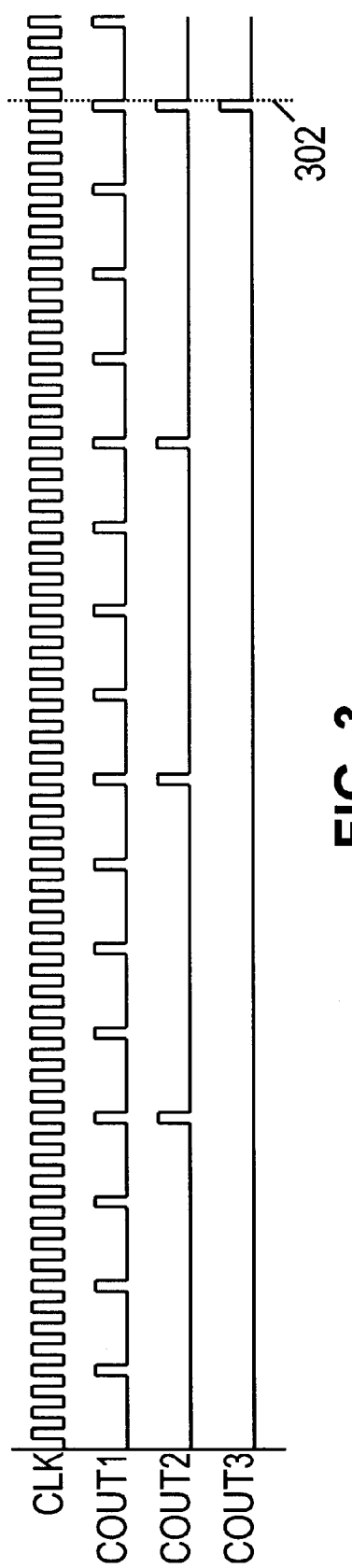
FIG. 3 illustrates the normal operation of a multi-stage count-by-four counter chain.

Turning momentarily to FIG. 3, an exemplary timing diagram is shown of the clock signals of a multi-stage counter in normal operation. For illustrative purposes, the counter stages are assumed to be count-by-four counters. Typical stages would count to a predetermined value larger than four. It is noted that for every four clock cycles, the first carry-out signal is asserted once. For every four assertions of the first carry-out signal, the second carry-out signal is asserted once. For every four assertions of the second carry-out signal, the third carry-out signal is asserted once. Thus, after $4^3=64$ clock cycles at the time indicated by line 302, all the stages of the multi-stage counter have been run through at least one complete count cycle.

Returning to FIG. 1, the first carry-out signal is coupled to logic circuit module #1 112. Logic circuit module #1 112 initiates or completes an operation on each assertion of the first carry-out signal. The results of these operations are available to logic circuit module #2 114 which periodically processes or modifies one of the results in response to the second carry-out signal. The operations of logic circuit module #2 114 are controlled by logic circuit module #3 116 which periodically monitors these operations in response to the third carry-out signal. To properly test the functionality of logic circuit module #2 114 and logic circuit module #3 116, it is desirable for the preceding circuit modules to have completed at least one operation.

Test unit 120 places the IC chip 101 in test mode and asserts the test signal. This causes OR gates 108 and 110 to provide an asserted carry-in input signal to second stage counter 104 and third stage counter 106. Under this configuration, all stages of the multi-stage counter chain count in unison.

Figure 4:
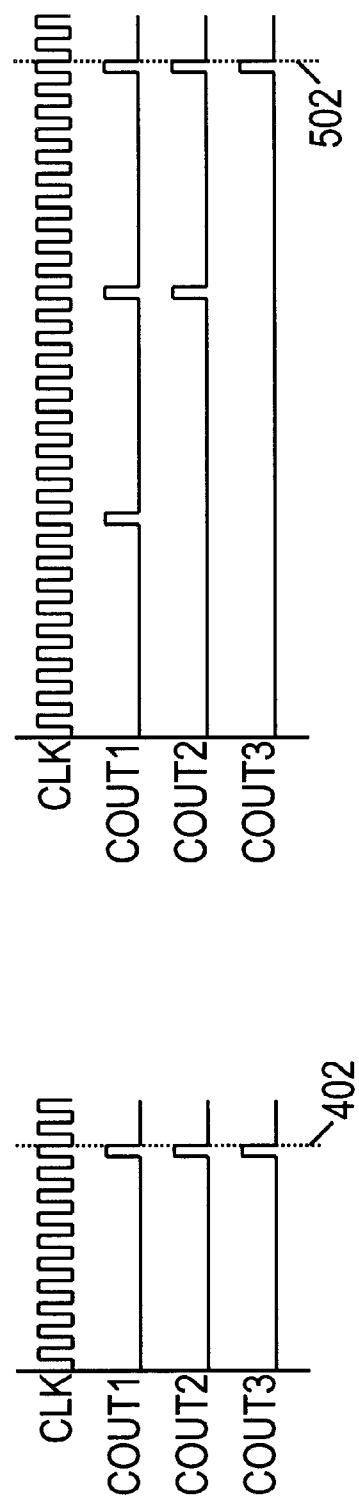
FIG. 4 illustrates the operation of a multi-stage count-by-ten counter chain in the testing configuration of FIG. 1.

Turning momentarily to FIG. 4, an exemplary timing diagram is shown of the clock signals of a multi-stage counter in the testing configuration of FIG. 1. The counter stages are here assumed to be identical count-by-ten counters. It is noted that for every ten clock cycles, each counter stage asserts the carry-out signal once. A complete count by each of the counters is finished after 10 clock cycles at the time indicated by line 402. Proper operation of the counters is determined by providing all the carry-out signals to AND gate 118 along with the test signal. The output of AND gate 118 is asserted once for every ten clock cycles only if all counters function as they should. It is noted that this test configuration must be modified for non-equal counter stages.

Returning to FIG. 1 with continued reference to FIG. 4, it may be observed that logic circuit module #1 112 is unable to complete an operation prior to activation of logic circuit module #2 114. Similarly, logic circuit module #2 114 is unable to perform an operation prior to activation of logic circuit module #3 116. Hence, testing of the multistage counter chain must be conducted separately from the testing of these circuit modules.

Figure 2:
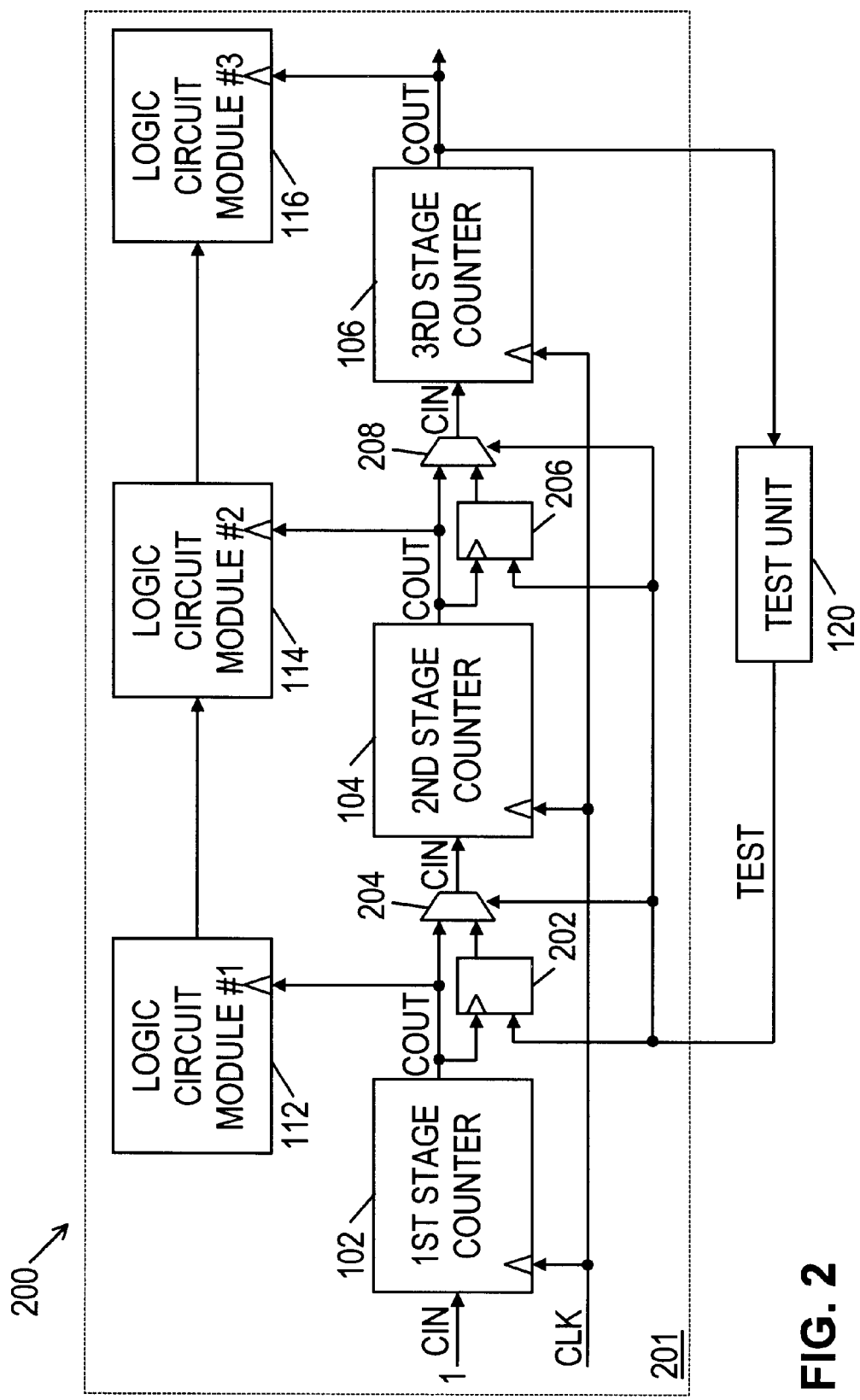
FIG. 2 shows a multi-stage counter testing configuration in one embodiment of the present invention.

Turning now to FIG. 2, a testing configuration 200 is shown. The test unit 120 is coupled to test an IC chip 201. IC chip 201 has a multi-stage counter chain comprised of first stage counter 102, second stage counter 104, and third stage counter 106. Each stage has a carry-in signal input and a carry-out signal output. The carry-out signal of each stage counter is coupled to the carry-in signal input of a subsequent stage counter via a latch and multiplexer circuit. The IC chip 201 also includes a logic circuit module #1 112, a logic circuit module #2 114, and a logic circuit module #3 116. These modules are coupled to receive carry-out signals from respective points in the multi-stage counter chain. The interdependence of the logic circuit modules is as described previously.

The latch and multiplexer circuit couplings in the multi-stage counter chain serve to advantageously provide a test mode in which the testing of the counter chain proceeds concurrently with testing of the circuit modules. Further, the testing of the counter chain does not require a full run-through of the maximum count of the counter chain which would represent an undesirably lengthy time period for the testing of the chip.

The first carry-out signal, which is provided by the first stage counter 102, is coupled to a multiplexer 204. The first carry out signal is also coupled to a latch 202, the output of which is coupled to multiplexer 204. When test unit 120 asserts a test signal, multiplexer 204 forwards the output of latch 202 to the second stage counter 104 carry-in signal input. When the test signal is de-asserted, multiplexer 204 forwards the first carry-out signal to the second stage counter 104 carry-in signal input. Latch 202 is configured to provide and hold an asserted output signal when the first carry-out signal is asserted in test mode (i.e. when the test signal is asserted). In effect, the first carry-out signal is latched and held in an asserted state after the first stage counter 102 has finished a complete count. This causes the carry-in signal of the second stage counter 104 to be continuously asserted so that the second stage counter 104 begins counting at the same rate as the first stage counter 102.

The second carry-out signal, which is provided by the second stage counter 104, is coupled in a similar arrangement as the first carry-out signal. Latch 206 functions to assert an output signal when the second carry-out signal is asserted in test mode. When the test signal is asserted, multiplexer 208 forwards the output of latch 206 to the carry-in signal input of third stage counter 106. After the second stage counter 104 finishes a complete count and asserts the second carry-out signal, the latch 206 operates via multiplexer 208 to hold the carry-in signal input of the third stage counter 106 in an asserted state, so that the third stage counter 106 begins to count at the same rate as the first stage counter 102. After the third stage counter 106 finishes a complete count, the third carry-out signal is asserted.

Tester 120 can verify the functionality of the multi-stage counter by determining the number of input clock cycles necessary before the final carry-out signal is asserted. If the counter stages are count-by-ten counters, a first assertion of the final carry-out signal should occur 30 clock cycles after the initiation of the input clock signal. In another embodiment, the tester 120 may also verify the timing of the carry-out assertions by each of the preceding stages.

Figure 5:
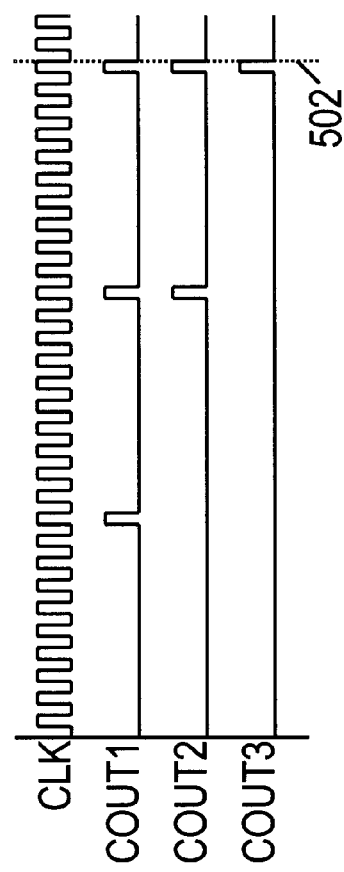
FIG. 5 illustrates the operation of a multi-stage count-by-ten counter chain in the testing configuration of FIG. 2.

Turning momentarily to FIG. 5, an exemplary timing diagram for a multi-stage counter chain in testing configuration 200 is shown. The counter stages are here assumed to be count-by-ten counters, although in this testing configuration the stages counters are not required to be the same. A complete count by each of the counters is finished after 30 clock cycles at the time indicated by line 502. Test unit 120 verifies the functionality of the multi-stage counter chain by simply determining that the final carry-out signal is asserted after the proper number of clock cycles. Returning to FIG. 2 with continued reference to FIG. 5, it is noted that the logic circuit module #1 112 receives a clock pulse from the first carry-out signal before any subsequent circuit modules receive a clock pulse. Similarly, logic circuit module #2 114 receives a clock pulse from the second carry-out signal before logic circuit module #3 116 receives a clock pulse from the third carry out signal. Hence, each of the circuit modules has at least 10 clock cycles to complete an operation before any subsequent circuit modules are activated. This allows verification of the subsequent modules' functionality to occur even as the verification of the multi-stage counter chain proceeds.

Test unit 120 typically supplies test input vectors for the circuit modules to operate on. In particular, logic circuit module #1 112 may process one or more test vectors to produce a result for subsequent modules to operate on. Testing configuration 200 advantageously initiates the operation of logic circuit module #1 112 prior to operation of the subsequent circuit modules so that this order of operation may occur.

The testing configuration 200 advantageously allows testing of interdependent circuit modules, which operate with clock signals derived from various points in the multistage counter chain, at the same time as testing of the multi-stage counter chain itself Further, the undesirably lengthy run-through to the maximum count of the multi-stage counter chain is advantageously avoided.

Numerous variations and modifications will become apparent to those skilled in the art once the above disclosure is fully appreciated. It is intended that the following claims be interpreted to embrace all such variations and modifications.

What is claimed is:

1. An integrated circuit which comprises:
   a multi-stage counter chain which includes:
      a first stage counter coupled to receive a clock signal and configured to count cycles of the clock signal, wherein the first stage counter is further configured to assert a first carry-out signal after the first stage counter counts a first predetermined number of clock cycles;
      a latch coupled to receive the first carry-out signal from the first stage counter, wherein the latch is configured to assert and hold a latch output signal if the first carry-out signal is asserted while a test mode signal is asserted;
      a multiplexer coupled to receive the latch output signal from the latch and the first carry-out signal from the first stage counter, wherein the multiplexer is configured to provide the latch output signal as a carry-in signal when the test mode signal is asserted, and wherein the multiplexer is further configured to provide the first carry out signal as the carry-in signal when the test mode signal is de-asserted; and
      a second stage counter coupled to receive the clock signal and the carry-in signal, wherein the second stage counter is configured to count cycles of the clock signal when the carry-in signal is asserted, wherein the second stage counter is further configured to assert a second carry-out signal after the second stage counter counts a second predetermined number of clock cycles;
   a first logic circuit module coupled to receive the first carry-out signal from the first stage counter;
   a second logic circuit module coupled to receive the second carry-out signal from the second stage counter; and
   a test unit coupled to the latch and the multiplexer, wherein the test unit is configured to generate the test mode signal, and wherein the test unit is further configured to verify operation of the first and the second stage counters.

2. The integrated circuit of claim 1, wherein the first logic circuit module performs an operation in response to the first carry-out signal, and wherein the second logic circuit module is coupled to receive the result of the operation from the first logic circuit module.

3. The integrated circuit of claim 1, wherein the integrated circuit is coupled to receive the test mode signal from a test unit, and wherein the integrated circuit is configured to enter a test mode in response to an assertion of the test mode signal.

4. The integrated circuit of claim 1, wherein the test unit verifies operation of the first stage counter by determining the number of cycles of said clock which occur before said assertion of the first carry-out signal.

5. A multi-stage counter having a test configuration comprising:
   a first stage counter configured to receive a clock, wherein the first stage counter is configured to responsively count to a first predetermined value and thereafter assert a first carry-out signal;
   a latch coupled to receive the first carry-out signal, wherein the latch is configured to assert and hold an output signal in response to an assertion of the first carry-out signal;
   a second stage counter operatively coupled to receive the output signal and the clock, wherein the second stage counter is configured to count to a second predetermined value while the output signal is asserted and thereafter provide a second carry-out signal;

a test unit operatively coupled to verify operation of the first and the second stage counters, wherein the test unit is configured to generate a test mode signal; and a multiplexer coupled to receive the first carry-out signal, the output signal, and the test mode signal, wherein the multiplexer is configured to provide the output signal to the second stage counter when the test mode signal is asserted, and wherein the multiplexer is configured to provide the first carry-out signal to the second stage counter when the test mode signal is de-asserted.

6. The multistage counter having a test configuration as recited in claim 5, further comprising:

a second latch coupled to receive the second carry-out signal, wherein the second latch is configured to assert and hold a second output signal in response to an assertion of the second carry-out signal; and a third stage counter operatively coupled to receive the second output signal and the clock, wherein the third stage counter is configured to count to a third predetermined value while the second output signal is asserted and thereafter provide a third carry-out signal.

7. The multistage counter having a test configuration as recited in claim 5, wherein the first carry-out signal is coupled as a clock signal to a first logic circuit module, wherein the second carry-out signal is coupled as a clock signal to a second logic circuit module, and wherein the second logic circuit module is configured operate on results provided by the first logic circuit module.

8. The integrated circuit of claim 5, wherein the test unit verifies operation of the first stage counter by determining number of cycles of said clock that occur before said assertion of the first carry out signal.

9. An integrated circuit comprising:

a multi-stage counter chain which includes:

a first stage counter coupled to receive a clock signal and configured to count cycles of the clock signal, wherein the first stage counter is further configured to assert a first carry-out signal after the first stage counter counts a first predetermined number of clock cycles;

a second stage counter coupled to receive the clock signal and configured to count cycles of the clock signal when a carry-in signal is asserted, wherein the second stage counter is further configured to assert a second carry-out signal after the second stage counter counts a second predetermined number of clock cycles, wherein during a normal mode of operation the first carry-out signal from the first stage counter is provided as the carry-in signal to the second stage counter; and test support circuitry coupled to said first and said second stage counters, wherein during a test mode of operation the test support circuity is configured to assert the carry-in signal provided to the second stage counter in response to an assertion of said first carry-out signal, and to hold the carry-in signal in an asserted state following a deassertion of said first carry-out signal, and wherein the test support circuity is configured to determine a number of cycles of the clock signal which occur prior to the assertion of the first carry-out signal.

10. The integrated circuit as recited in claim 9 further comprising:

a first logic circuit module coupled to receive the first carry-out signal from the first stage counter;

a second logic circuit module coupled to receive the second carry-out signal from the second stage counter.

11. The integrated circuit as recited in claim 9 wherein said test support circuitry includes a latch coupled to said first stage counter, wherein an output signal of said latch is asserted in response to an assertion of said first carry-out signal, and wherein during the test mode of operation, the output signal of the latch circuit is provided as the carry-in signal to the second stage counter.

12. The integrated circuit as recited in claim 11 further comprising a multiplexer coupled to said first stage counter, said second stage counter, and said latch, wherein during the normal mode of operation the multiplexer provides the first carry-out signal from the first stage counter as the carry-in signal to the second stage counter, and wherein during the test mode of operation, the multiplexer provides the output signal from the latch as the carry-in signal to the second stage counter.

* * * * *